United States Patent [19]

Hattori

[11] Patent Number: 5,508,721
[45] Date of Patent: Apr. 16, 1996

[54] DISPLAY UNIT HAVING AUTOMATIC TESTING FUNCTION

[75] Inventor: Hiroshi Hattori, Kawasaki, Japan

[73] Assignee: Fujitsu Limited, Kawasaki, Japan

[21] Appl. No.: 213,513

[22] Filed: Mar. 16, 1994

[30] Foreign Application Priority Data

Apr. 21, 1993 [JP] Japan ................... 5-094626

[51] Int. Cl.⁶ ........................... G09G 5/00
[52] U.S. Cl. .................. 345/185; 345/117; 345/904
[58] Field of Search ............... 345/185, 186, 345/189, 190, 192, 193, 196, 197, 198, 200, 203, 112, 117, 214, 904; 365/230.01, 230.05, 230.09, 189.01, 189.03, 189.04, 189.05, 189.07

[56] References Cited

U.S. PATENT DOCUMENTS

| | | | |
|---|---|---|---|
| 4,931,785 | 6/1990 | Ishii | 345/203 |
| 4,987,559 | 1/1991 | Miyauchi et al. | 365/189.04 |

*Primary Examiner*—Richard Hjerpe
*Assistant Examiner*—Xiao M. Wu

*Attorney, Agent, or Firm*—Staas & Halsey

[57] ABSTRACT

A display unit includes a central processing unit (CPU) for outputting display data, a frame buffer having first and second ports and temporarily storing the display data received from the CPU via the first port, a display device having a display screen for displaying the display data read from the frame buffer means and received via the second port and having a display controller for generating and outputting image generating signals, a first control register for storing the display data output from the CPU and having a specific address, a second control register for reading the display data from the frame buffer and storing the display data in response to a register set signal, where the second control register supplies the display data stored therein to the CPU, and a comparator circuit for comparing the image generating signals output from the display controller and the display data stored in the first control register and for supplying the register set signal to the second control register when the image generating signals output from the display controller corresponds to the display data stored in the first control register. The CPU has a mechanism for comparing and checking the display data stored in the first control register and the display data stored in the second control register.

10 Claims, 4 Drawing Sheets

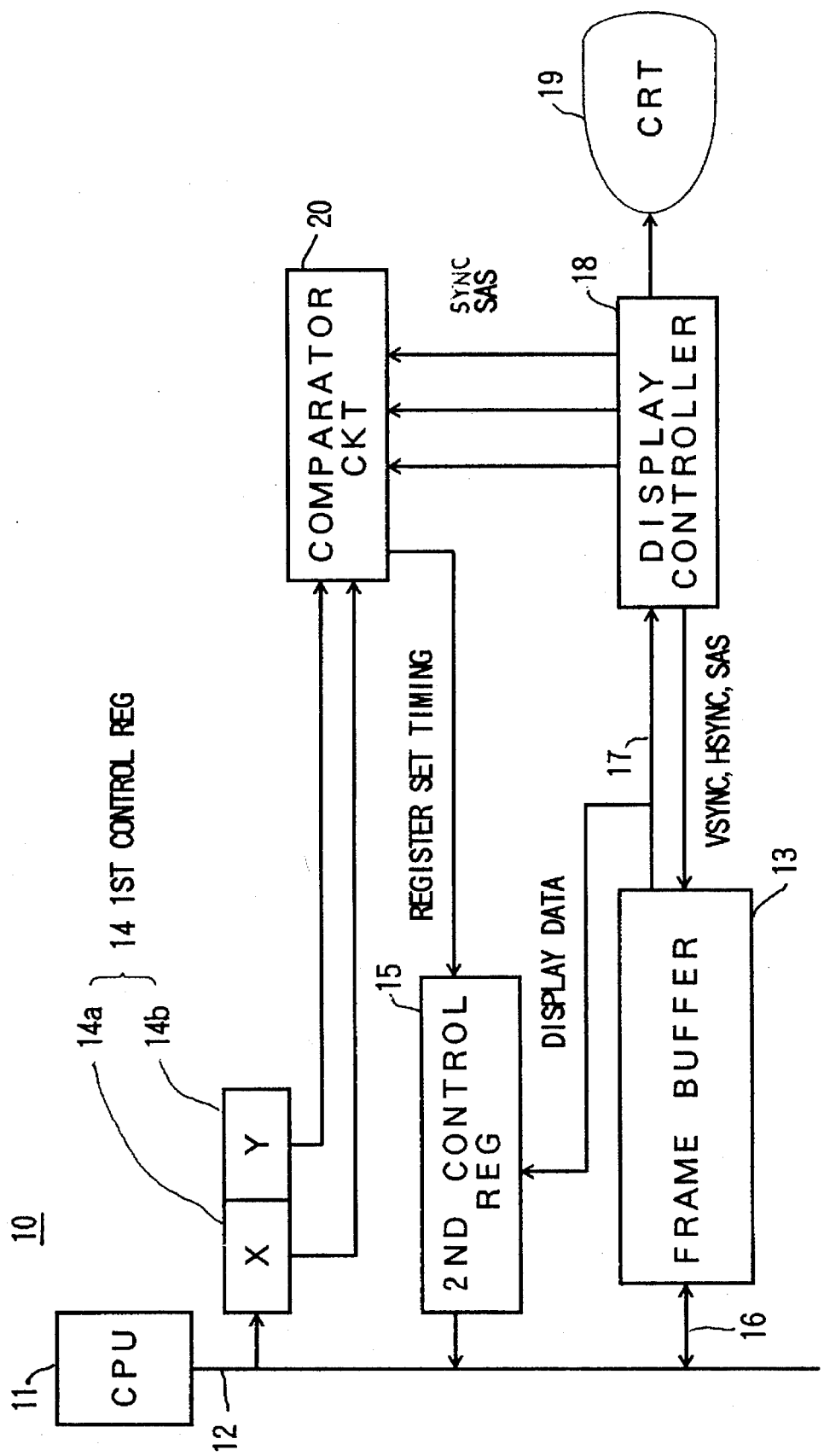

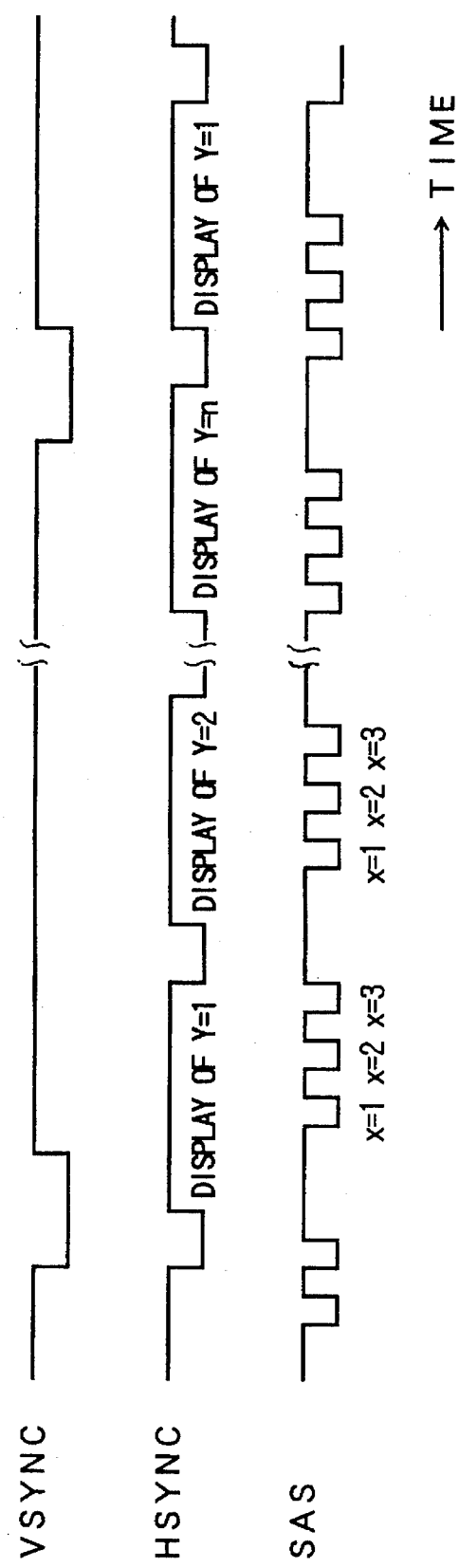

DISPLAY UNIT HAVING AUTOMATIC TESTING FUNCTION

BACKGROUND OF THE INVENTION

The present invention generally relates to display units and, more particularly, to a display unit which can automatically test display data.

Recently, computer graphic output units have been proposed to output various graphics. In most cases, a cathode ray tube (CRT) such as a television monitor is used as the graphic output unit.

On the other hand, in order to make an accurate data display, it is necessary to test whether or not the input data are correctly displayed on the CRT.

Accordingly, there are demands to realize a method of accurately and efficiently testing the display unit.

Generally, a CRT display unit of a work station or the like uses a memory which is often referred to as a frame buffer for temporarily storing display data. FIG.1 shows an example of such a CRT display unit.

A CRT display unit 1 shown in FIG. 1 includes a frame buffer 2, a central processing unit (CPU) 4, a display controller 7, and a CRT 8.

The frame buffer 2 has two input/output ports and is formed by a pair of memories which are mutually unaffected. In other words, the frame buffer 2 is a so-called dual port random access memory (RAM).

One input/output port of the frame buffer 2 is called a RAM port 3. The data can be read from arbitrary addresses via this RAM port 3. In addition, the RAM port 3 is connected to a bus 5 of the CPU 4, and the display data can be written via this RAM port 3.

The other input/output port of the frame buffer 2 is called a serial access memory (SAM) port 6. The data can be read from and written to consecutive addresses via this SAM port 6, and the SAM port 6 is used for sending the data to the display controller 7. The display controller 7 drives and controls the CRT 8.

Conventionally, when carrying out a read/write test with respect to the display unit 1 using the frame buffer 2 which is formed by two independent memories, the test in general was carried out by performing a data write/read operation of the frame buffer (dual port RAM) 2.

However, in the display unit 1 which uses the frame buffer 2, there is no guarantee that the data are accurately displayed even if the written data are read out correctly because the RAM and the SAM are independent. In other words, according to the conventional display unit 1, it was impossible to directly compare the data input to the RAM port 3 and the data output to the SAM port 6.

For this reason, in order to carry out the read/write test, the only way was to write a specific pattern in the frame buffer 2 and to display the specific pattern on the CRT 8 so that the operator can check to see if the displayed specific pattern matches the specific pattern written into the frame buffer 2. This was the only way of obtaining accurate information, and there was a problem in that the test consequently required a troublesome operation. In addition, in order to make a detailed test, it was the only way to connect a measuring equipment to each display unit 1, and there was also a problem in that the construction of the testing equipment becomes complex and bulky.

SUMMARY OF THE INVENTION

Accordingly, it is a general object of the present invention to provide a novel and useful display unit in which the problems described above are eliminated.

Another and more specific object of the present invention is to provide a display unit comprising processing means for outputting display data, frame buffer means, having first and second ports, for temporarily storing the display data received from the processing means via the first port, display means, having a display screen, for displaying the display data read from the frame buffer means and received via the second port, the display means having display controller means for generating and outputting image generating signals, first control register means, coupled to the processing means, for storing the display data output from the processing means and having a specific address, second control register means, coupled to the second port of the frame buffer means and the processing means, for reading the display data from the frame buffer means and storing the display data in response to a register set signal, the second control register means having means for supplying the display data stored therein to the processing means, and comparator means, coupled to the first control register means and the display means, for comparing the image generating signals output from the display controller means and the display data stored in the first control register means, and for supplying the register set signal to the second control register means when the image generating signals output from the display controller means corresponds to the display data stored in the first control register means, where the processing means has means for comparing and checking the display data stored in the first control register means and the display data stored in the second control register means. According to the display unit of the present invention, it is possible to directly compare and check the data input and output via the two ports of the frame memory. As a result, it is possible to automatically and accurately check abnormalities of the display unit at a high speed.

Still another object of the present invention is to provide a processing unit adapted to a display unit having display means and comprising frame buffer means, having first and second ports, for temporarily storing display data via the first port, display controller means for supplying the display data read from the frame buffer means and received via the second port to the display means and for generating and outputting image generating signals, first control register means for storing the display data having a specific address, second control register means, coupled to the second port of the frame buffer means, for reading the display data from the frame buffer means and storing the display data in response to a register set signal, and comparator means, coupled to the first control register means and the display controller means, for comparing the image generating signals output from the display controller means and the display data stored in the first control register means, and for supplying the register set signal to the second control register means when the image generating signals output from the display controller means corresponds to the display data stored in the first control register means. According to the processing unit of the present invention, it is possible to enable direct comparison and checking of the data input and output via the two ports of the frame memory in the display unit. As a result, it is possible to automatically and accurately check abnormalities of the display unit at a high speed.

Other objects and further features of the present invention will be apparent from the following detailed description when read in conjunction with the accompanying drawings.

BRIEF DESCRIPTION OF THE DRAWINGS

FIG. 2 is a system block diagram showing an embodiment of a display unit according to the present invention;

FIG. 3 is a timing chart for explaining the relationship of vertical synchronizing signals, horizontal synchronizing signals and SAS clock signals;

DESCRIPTION OF THE PREFERRED EMBODIMENTS

Figure 1:
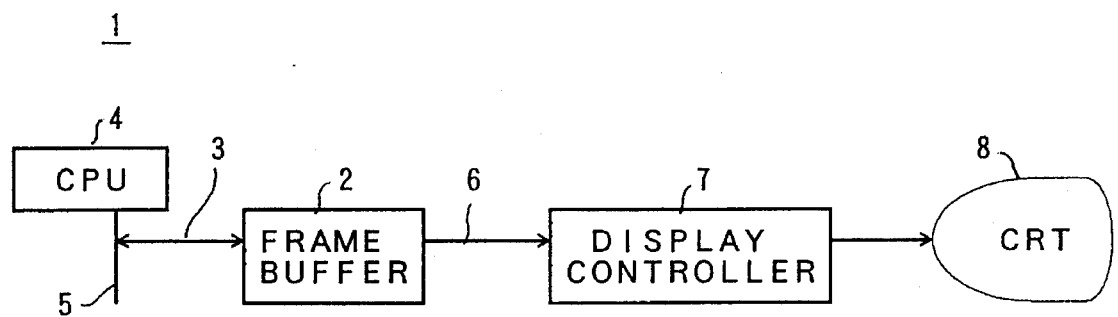
FIG. 1 is a system block diagram showing an example of a conventional display unit.

FIG. 2 shows an embodiment of a display unit according to the present invention. A display unit 10 shown in FIG. 2 includes a CPU 11, a frame buffer 13, a first control register 14, a second control register 15, a display controller 18, a CRT 19, and a comparator circuit 20.

The CPU 11 carries out various operations related to the image processing, and outputs display data which are generated by the operations to a CPU bus 12. The CPU bus 12 is a two-way bus through which the data can be input and output. The frame buffer 13, the first control register 14, the second control register 15 and the like are connected to this CPU bus 12.

The frame buffer 13 is made up of a dual port RAM. As described above, this dual port RAM is formed by a RAM and a SAM which are constructed to be mutually unaffected. The data can be read from arbitrary addresses of the RAM of the frame buffer 13, and the data can be input and output with respect to the RAM via a RAM port 16. The data read and data write can be carried out with respect to consecutive addresses of the SAM. The display data are supplied to the display controller 18 via a SAM port 17.

The frame buffer 13 having the above described construction has the function of temporarily storing the display data which are received from the CPU 11 via the CPU bus 12. The display data supplied from the CPU 12 are not supplied directly to the display controller 18, and. instead, are temporarily stored in the frame buffer 13, because the data transmission speed of the display data from the CPU 11 is different from the display speed at which the display data are displayed on the CRT 19 via the display controller 18.

The display controller 18 drives and controls the CRT 19 which forms a display portion. This display controller 18 reads the display data stored in the frame buffer 13 and displays the display data on the CRT 19. The display controller 18 has the function of generating vertical synchronizing signals VSYNC and horizontal synchronizing signals HSYNC which become image generating signals when making the image display.

The display controller 18 reads predetermined display data from the frame buffer 13 according to the following procedure. The display data are stored in the frame buffer 13 at addresses corresponding to the coordinates on the screen of the CRT 19, on which the display data are to be displayed. In other words, the X–Y coordinate is set for each image data display position of the CRT 19, and each display datum is stored in the frame buffer 13 at an address corresponding to the X–Y coordinate on the screen of the CRT 19 where the display datum is to be displayed.

As described above, the display controller 18 generates the vertical synchronizing signals VSYNC and the horizontal synchronizing signals HSYNC. When reading the display data from the frame buffer 13, the Y-coordinate value of the display data is obtained by counting the vertical synchronizing signals VSYNC, and the X-coordinate of the display data is obtained by counting clock signals SAS which are generated based on the horizontal synchronizing signals HSYNC. The clock signals SAS are supplied to the comparator circuit 20 which will be described later.

FIG. 3 is a timing chart showing the relationship of the vertical synchronizing signals VSYNC, the horizontal synchronizing signals HSYNC and the clock signals SAS which are respectively generated by the display controller 18.

Accordingly, the display controller 18 reads, from the frame buffer 13 via the SAM port 17, the data (image signals, luminance signals and the like) from predetermined addresses which are determined based on the vertical synchronizing signals VSYNC and the clock signals SAS, and multiplexes or superimposes the vertical synchronizing signals VSYNC and the horizontal synchronizing signals HSYNC onto the read data so as to generate a composite video signal. The generated composite video signal is supplied to the CRT 19, and the CRT 19 displays an image based on this composite video signal.

Next, a description will be given of a circuit which forms an important part of the present invention and which operates when testing the display unit 1. The test may be a read/write test.

The first control register 14 is connected to the CPU bus 12, and an address at a predetermined position on the display screen is set in response to an instruction from the CPU 11. More particularly, the X-coordinate value on the display screen is set in a register portion 14a of the first control register 14, and the Y-coordinate value on the display screen is set in the register portion 14b of the first control register 14. The first control register 14 is connected to the comparator circuit 20, and the comparator circuit 20 can read the address stored in the first control register 14.

Figure 4:
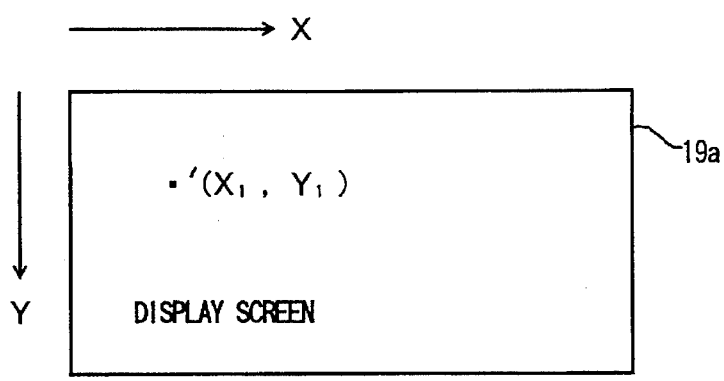
FIG. 4 is a diagram for explaining a predetermined address on a CRT screen.

In the following description, it will be assumed for the sake of convenience that an address, corresponding to a coordinate $(X_1, Y_1)$ on a display screen 19a of the CRT 19 shown in FIG. 4, is set in the register portions 14a and 14b of the first control register 14 in response to an instruction from the CPU 11. In other words, the X-coordinate value $X_1$ is set in the register portion 14a, and the Y-coordinate value $Y_1$ is set in the register portion 14b.

The second control register 15 is connected to the SAM port 17 of the frame buffer 13 and to the comparator circuit 20. When a register set signal is supplied from the comparator circuit 20 at a predetermined timing, as will be described later, the display data to be supplied to the display controller 18 are read from the frame buffer 13 and temporarily stored in the second control register 15. In addition, the second control register 15 is also connected to the CPU bus 12, and the temporarily stored display data are output to the CPU 11 based on an instruction from the CPU 11.

The comparator circuit 20 compares the vertical synchronizing signals VSYNC, the horizontal synchronizing signals HSYNC, the clock signals SAS, and the address data $(X_1, Y_1)$ stored in the first control register 14. The comparator 20 supplies the register set signal to the second control register 15 when signals corresponding to the coordinate values $(X_1, Y_1)$ stored in the first control register 14 are output from the display controller 18.

Figure 5:
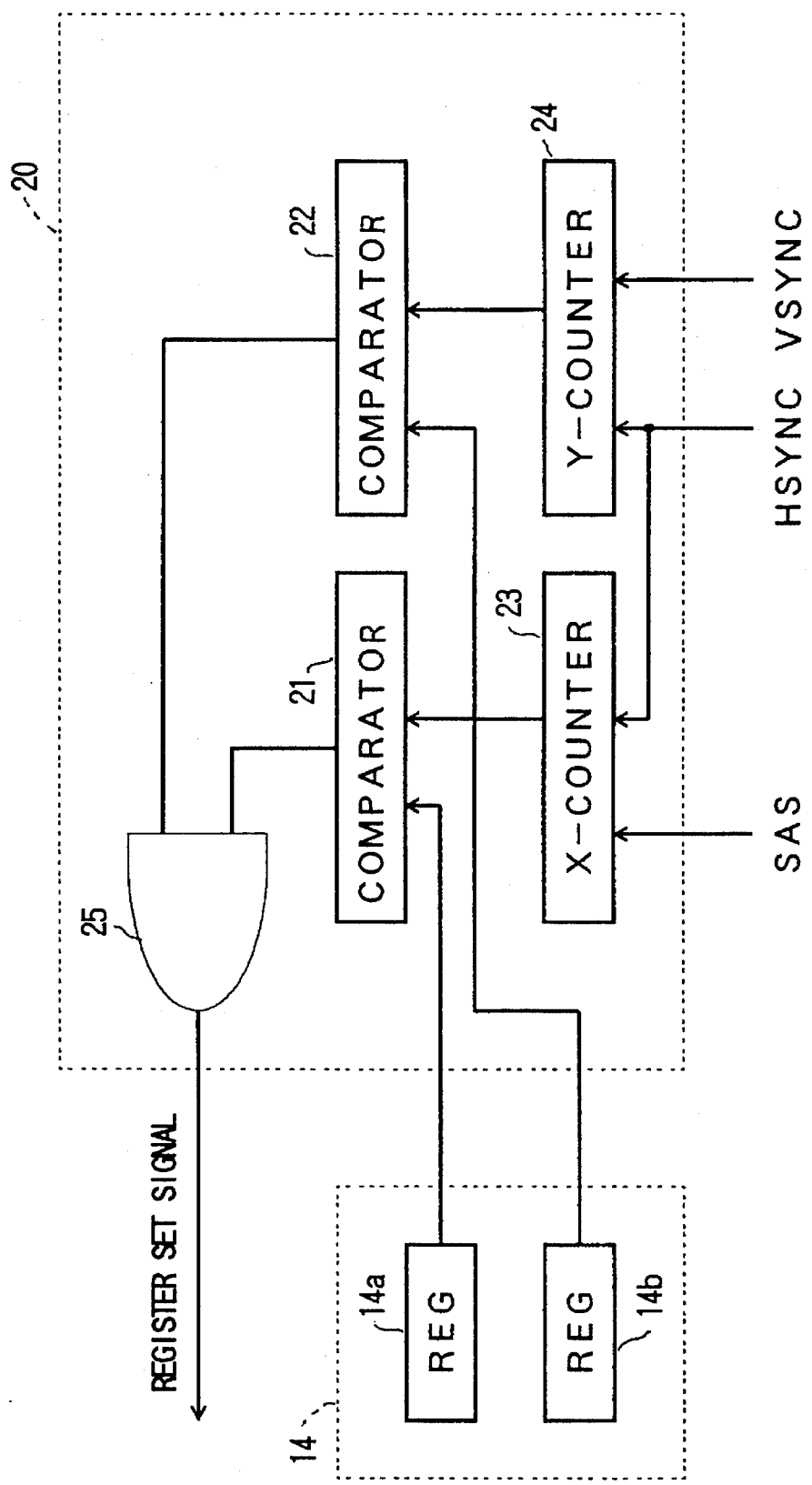
FIG. 5 is a circuit diagram showing an embodiment of a comparator circuit of the display unit shown in FIG. 2.

FIG.5 shows an embodiment of the construction of the comparator circuit 20, together with the first control register 14. As shown in FIG. 5, the comparator circuit 20 includes an pair of comparators 21 and 22, a X-counter 23, a Y-counter 24, and an AND-gate 25.

The horizontal synchronizing signals HSYNC and the clock signal SAS are supplied to the X-counter 23, and the X-counter 23 obtains the X-coordinate value of the display data, supplied from the frame buffer 13 to the display controller 18, by counting the clock signals SAS (clock pulses). The obtained X-coordinate value is supplied to the comparator 21. On the other hand, the horizontal synchronizing signals HSYNC and the vertical synchronizing signals VSYNC are supplied to the Y-counter 24, and the Y-counter 24 obtains the Y-coordinate value of the display data supplied from the frame buffer 13 to the display controller 18 by counting the vertical synchronizing signals VSYNC (vertical synchronizing pulses). The obtained Y-coordinate value is supplied to the comparator 22.

On the other hand, the X-coordinate value of the predetermined address data stored in the register portion 14a of the first control register 14 is supplied to the comparator 21. Hence, the comparator 21 compares the X-coordinate value of the display data obtained from the X-counter 23 and the X-coordinate value ($X_1$) of the predetermined address data. If the two compared X-coordinate values match, the comparator 21 supplies a high-level signal to the AND-gate 25.

Similarly, the Y-coordinate value of the predetermined address data stored in the register portion 14b of the first control register 14 is supplied to the comparator 22. Hence, the comparator 22 compares the Y-coordinate value of the display data obtained from the Y-counter 24 and the Y-coordinate value ($Y_1$) of the predetermined address data. If the two compared Y-coordinate values match, the comparator 22 supplies a high-level signal to the AND-gate 25.

Accordingly, when the predetermined address data ($X_1$, $Y_1$) stored in the first control register 14 and the X and Y coordinate values respectively output from the X-counter 23 and the Y-counter 24 match, both the comparators 21 and 22 output the high-level signal to the AND-gate 25. As a result, the AND-gate 25 supplies a high-level signal to the second control register 15 as the register set signal.

When the second control register 15 receives the high-level register set signal from the comparator circuit 20 having the construction described above, the second control register 15 reads from the frame buffer 13 the display data which are being supplied from the frame buffer 13 to the display controller 18 at that point in time, and stores the read display data.

As described above, the CPU 11 can read the display data stored in the second control register 15 via the CPU bus 12. In addition, the CPU 11 also holds the display data corresponding to the predetermined address data ($X_1$, $Y_1$) stored in the first control register 14.

Hence, the CPU 11 can compare and check the display data stored in the second control register 15 and the display data held in the CPU 11 and corresponding to the predetermined address data ($X_1$, $Y_1$). In this case, the display data held in the CPU 11 and corresponding to the predetermined address data ($X_1$, $Y_1$) are the data input to the RAM port 16 of the frame buffer 13. In addition, the display data stored in the second control register 15 are the data output from the SAM port 17 of the frame buffer 13.

Therefore, even though the frame buffer 13 is made up of the RAM and SAM which are two mutually independent memories, the CPU 11 can directly compare and check the data output from the two memory ports, that is, the RAM port 16 and the SAM port 17, of the frame buffer 13. For this reason, it is possible to automatically carry out the read/write test, and the accuracy and efficiency of the test can be improved.

The display unit of the described embodiment only uses one frame buffer. However, the present invention is applicable to display units which use two or more frame buffers. For example, the present invention isapplicable to a display unit which makes a so-called multi-window display by superimposing contents of two kinds of frame buffers, and the test can be carried out similarly to the described embodiment. In addition, the present invention is also applicable to the test which reads and writes complicated memory contents, such as the display function, in bit units using control plane and double buffer control. The present invention can also automatically and accurate carry out the test in such cases, for use in detecting abnormalities of the display unit.

Further, the present invention is not limited to these embodiments, but various variations and modifications may be made without departing from the scope of the present invention.

What is claimed is:

1. A display unit comprising:

processing means for outputting display data;

frame buffer means, having first and second ports and coupled to said processing means by said first port, for receiving via the first port and temporarily storing therein display data output by said processing means;

a display unit having a display screen and a display controller means, coupled to the second port of the frame buffer means, for reading display data from said frame buffer means via the second port and displaying the read display data on the display screen and, further, for generating and outputting image generating signals;

first control register means, coupled to said processing means, for storing an address corresponding to display data output from said processing means;

second control register means, and coupled to the second port of said frame buffer means and to said processing means, for reading display data from said frame buffer means, output through the second port thereof, and storing the thus read display data in response to a register set signal, said second control register means further comprising means responsive to an instruction from said processing means for supplying the display data stored therein to said processing means;

comparator means, coupled to said first control register means and to said display means, for comparing the image generating signals output by said display controller means and the address stored in said first control register means and for supplying the register set signal to said second control register means when the image generating signals, output from said display controller means, correspond to the address stored in said first control register means; and said processing means further comprising means for comparing display data stored therein, corresponding to the address stored in said first control register means, and the display data stored in said second control register means and supplied through the first port to the processing means in response to the instruction therefrom.

2. The display unit as claimed in claim 1, wherein said processing means directly and automatically compares the display data stored therein and corresponding to the display data stored in said first control register means and the display data stored in said second control register means.

3. The display unit as claimed in claim 1, wherein said display controller means of said display means generates vertical synchronizing signals and horizontal synchronizing signals as the image generating signals.

4. The display unit s claimed in claim 1, wherein said frame buffer means further comprises a first memory having the first port and a second memory having the second port, sasid first and second memories being mutually unaffected.

5. The display unit as claimed in claim 1, wherein said frame buffer means further comprises a dual port random access memory having a random access memory port which forms the first port and a serial access memory port which forms the second port.

6. The display unit as claimed in claim 1, wherein said comparator means further comprises:

means for generating X and Y coordinate values of display data positions on the display screen, based on the image generating signals output by said display controller means; and means for comparing the generated X and Y coordinate values with X and Y coordinate values of the specific address stored in said first control register means and for supplying the register set signal to said second control register means when the compared X and Y coordinate values match.

7. A processing unit for a display unit having display means, said processing unit comprising:

frame buffer means, having first and second ports, for temporarily storing display data received therein via the first port;

display controller means for supplying the display data, read from said frame buffer means via the second port, to the display means and for generating and outputting image generating signals;

first control register means for storing a specific address of corresponding display data;

second control register means, coupled to the second port of said frame buffer means, for reading the display data from said frame buffer means via the second port and storing the display data, thus read, in response to a register set signal; and comparator means, coupled to said first control register means and said display controller means, for comparing the image generating signals output by said display controller means and the address stored in said first control register means, and for supplying the register set signal to said second control register means when the image generating signals, output by said display controller means, correspond to the address stored in said first control register means.

8. The processing unit as claimed in claim 7, which further comprises:

processing means having means for comparing the display data, corresponding to the address stored in said first control register means, and the display data, stored in said second control register means.

9. The processing unit as claimed in claim 7, wherein:

said processing means, further, supplies the display data to said frame buffer means; and said second control register means further comprises means, responsive to an instruction received thereby from said processing means, for supplying the display data stored therein to said processing means.

10. A display unit comprising:

a bus;

a processor coupled to the bus and which generates and outputs display data onto the bus;

a frame buffer having a first port coupled to the bus for receiving display data, output by the processor onto the bus, and storing the received display data, the frame buffer having a second port;

a display controller coupled to the second port of the frame buffer and an associated display screen coupled to the display controller, the display controller reading the display data stored in the frame buffer via the second port of the frame buffer and generating and outputting image generating signals corresponding to the display data read thereby;

a first control register, coupled to the bus, storing a specific address of corresponding display data, as output onto the bus by the processor;

a second control register coupled to the second port of the frame buffer and coupled through the bus to the processor, the second control register being responsive to a register set signal for reading the display data stored in the frame buffer and output therefrom through the second port of the frame buffer and for storing the read display data and, further, being responsive to an instruction from the processor for supplying the stored display data to the processor;

a comparator, coupled to the first control register and to the display controller, which compares the image generating signals output by the display controller, for the corresponding display data read by the display controller, and the address data for the corresponding display data stored in the first control register, and produces the register set signal as an output thereof when the image generating signals output by the display controller have addresses which match the addresses stored in the first controller of the corresponding display data; and the processor, further, comparing the display data stored therein, corresponding to the address stored in the first control register, with the display data stored in the second control register.

* * * * *

UNITED STATES PATENT AND TRADEMARK OFFICE
CERTIFICATE OF CORRECTION

PATENT NO. : 5,508,721
DATED : Apr. 16, 1996
INVENTOR(S) : HATTORI

It is certified that error appears in the above-indentified patent and that said Letters Patent is hereby corrected as shown below:

Drawings:
Sheet 3 of 4, replace the drawing (Fig. 3) with the following (Figs. 3A-3C):

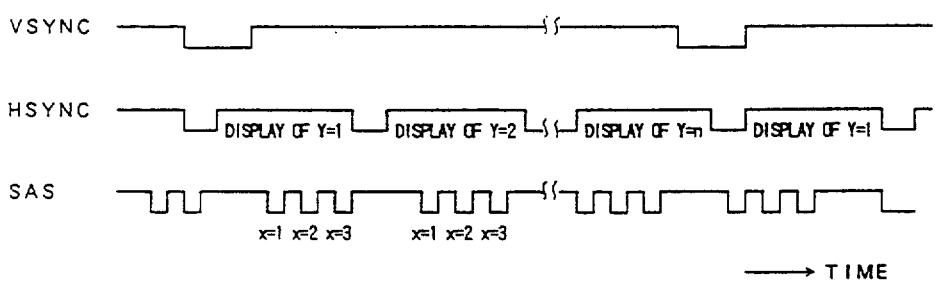

Col. 3, line 3, change "Fig. 3 is a timing chart" to --Figs. 3A, 3B and 3C are timing charts--;
line 5, after "signals," insert --respectively;--.

Col. 4, line 7, change "FIG. 3 is a timing chart" to --Figs. 3A, 3B and 3C are timing charts--;
line 9, after "SAS" insert --, respectively,--;
line 10, delete "respectively";
line 13, delete "predetermined";
line 66, change "an pair" to --a pair--; and change "a X-counter" to --an X-counter--.

UNITED STATES PATENT AND TRADEMARK OFFICE
CERTIFICATE OF CORRECTION

PATENT NO. : 5,508,721
DATED : Apr. 16, 1996
INVENTOR(S) : HATTORI

It is certified that error appears in the above-indentified patent and that said Letters Patent is hereby corrected as shown below:

Col. 5, line 62, delete "directly".

Col. 6, line 57 (claim 1, second to last line), delete "through the first port";
line 61 (claim 2, line 3), delete "display" (second occurrence);
line 62 (claim 2, line 4), change "data" to --address--.

Col. 7, line 50 (claim 8, line 4), after "to the" insert --specific--.

Signed and Sealed this

Twenty-seventh Day of August, 1996

Attest:

BRUCE LEHMAN

Attesting Officer    Commissioner of Patents and Trademarks